(12) United States Patent
Holdsclaw et al.

(10) Patent No.: US 6,236,197 B1
(45) Date of Patent: May 22, 2001

(54) APPARATUS AND METHOD FOR DETECTING TAMPERING IN A MULTIPHASE METER

(75) Inventors: Scott T. Holdsclaw, Raleigh; Edward J. Beroset, Chapel Hill, both of NC (US)

(73) Assignee: ABB Power T&D Company Inc., Raleigh, NC (US)

( * ) Notice: Subject to any disclaimer, the term of this patent is extended or adjusted under 35 U.S.C. 154(b) by 0 days.

(21) Appl. No.: 09/311,346

(22) Filed: May 13, 1999

Related U.S. Application Data

(60) Provisional application No. 60/085,650, filed on May 15, 1998.

(51) Int. Cl.[7] .................................................. G01R 35/04
(52) U.S. Cl. ............................................ 324/110; 324/74
(58) Field of Search ......................... 324/110, 74, 521, 324/86; 702/58

(56) References Cited

U.S. PATENT DOCUMENTS

| | | | |
|---|---|---|---|
| 4,053,876 | * 10/1977 | Taylor | 324/521 X |
| 4,551,811 | * 11/1985 | Taniguti | 324/510 X |
| 5,056,107 | 10/1991 | Johnson et al. | 375/1 |
| 5,227,668 | 7/1993 | Mutch et al. | 307/131 |
| 5,544,089 | 8/1996 | Hemminger et al. | 364/492 |
| 5,673,196 | 9/1997 | Hoffman et al. | 364/483 |

* cited by examiner

Primary Examiner—Glenn W. Brown
(74) Attorney, Agent, or Firm—Woodcock Washburn Kurtz Mackiewicz & Norris

(57) ABSTRACT

An apparatus for determining loss of reference voltage (indicating possible tampering) in a 2-element electronic meter that includes a processor for determining electrical power from voltage and current signals, and a display for indicating an operating status of the meter. To determine if the reference voltage of the meter in a 3-wire delta or network installation has been lost, a measurement of the phase angle difference between the two phases is made. If the phase difference is equal to a predetermined value, the meter indicates on the display that loss of reference voltage and possible tampering has taken place. The apparatus may further be adapted to determine a length of time that this condition has occurred such that the appropriate enforcement and billing agencies may be informed.

23 Claims, 12 Drawing Sheets

APPARATUS AND METHOD FOR DETECTING TAMPERING IN A MULTIPHASE METER

CROSS REFERENCE TO RELATED APPLICATION

This Application claims benefit of U.S. provisional Application Ser. No. 60/085,650 filed May 15, 1998.

This application claims the benefit of U.S. Provisional Patent Application Ser. No. 60/085,650, to Holdsclaw et al., filed May 15, 1998, entitled "APPARATUS AND METHOD FOR DETECTING TAMPERING IN A MULTIPHASE METER".

FIELD OF INVENTION

The present invention relates generally to the field of utility meters for metering electrical power consumption. More particularly, the present invention relates to an apparatus and method for detecting tampering in a multi phase meter by determining voltage phase angles relationships.

BACKGROUND OF THE INVENTION

Meters for metering the various forms of electrical power are well known. Utility company meters can be of three general types, namely, electromechanical based meters (output generated by a rotating disk), purely electronic component based meters (output component generated without any rotating parts) and a hybrid mechanical/electronic meter. In the hybrid meter, a so-called electronic register is coupled, usually optically, to a rotating disk. Pulses generated by the rotating disk, for example by light reflected from a spot painted on the disk, are utilized to generate an electronic output signal.

It will be appreciated that the use of electronic components in electric meters has gained considerable acceptance due to their reliability and extended ambient temperature ranges of operation. Moreover, contemporary electronic signal processing devices, such as microprocessors, have a greater accuracy potential for calculating electrical power use than prior mechanical devices. Consequently, various forms of electronic based meters have been proposed which are virtually free of any moving parts. Several meters have been proposed which include a microprocessor.

Many of the new solid-state meters also include a liquid crystal display (LCD) to convey information to individuals or equipment externally of the meter. Typically, the LCD display includes annunciators that are turned ON to indicate the presence of the different voltage phases (e.g., Phase A, Phase B, and Phase C in a polyphase meter) and turned OFF to indicated the absence of one or more of the phases. In some situations, the annunciator is flashed to indicate the absence of phase.

Providers of electricity are concerned with incorrect wiring problems, and unscrupulous individuals who tamper with meters to circumvent the metering of power consumption and payment for power usage. Therefore, meters have historically been equipped with phase voltage indications to signal the presence of voltages on individual phases. This helps detect normal phase voltage outages as well as tampering where a phase voltage is removed while the meter still appears to be operating due to the voltages on the other phases. However, older meters simply looked for the presence of a voltage, and not at the actual magnitude of the voltage. This made the assumption that if a phase voltage was removed, there would be no voltage remaining; therefore, no need to check the magnitude.

However, in metering with 2-element polyphase meters, there will typically be three voltage points that are connected, with one of the three being the reference for the other two. The two normal installations are 3-wire delta and 3-wire wye. The 3-wire delta connects to phases A and C with respect to phase B (the $3^{rd}$ connection). The angle between the two voltage Va-b and Vc-b will be either 60 degrees or 300 degrees. And the two voltages will be the actual line-to-line voltage of the service. The 3-wire wye connects to phases A and C as well, but with respect to ground (the $3^{rd}$ connection). The angle between the two voltages Va-g and Vc-g will either be 120 degrees or 240 degrees. And the two voltages will be the actual line-to-neutral (or ground) voltages (which is 57.7% of the line-to-line voltage).

For a 2-element meter, there have typically been two phase indicators, one for each non-reference phase. In either service type case, removal of phase A or C would generate an indication of the loss of a phase voltage since there would be no voltage on that phase with respect to the reference, and would cause one of the phase indicators to signal loss of a phase. However, if the reference voltage was lost, and the reference point was allowed to float, then the reference should float to halfway between the two remaining voltages. Now each phase to reference voltage would be 50% of the phase to phase voltage. This reduction in the voltage magnitude along with the change in angle relationship to the respective phase currents will significantly reduce the registration of the meter. However, since there is still a non-zero voltage across each phase to reference voltage, the phase indicators will still indicate presence of voltage on both phases.

Consequently, a need exists for an electronic meter that can automatically detect and indicate loss of the neutral as well as the other phase voltages due to mis-wiring or tampering. The present invention solves the aforementioned problems through the use of a novel detection technique that measures the phase angle difference between the normally connected phases (e.g. Phase A and Phase C with respect to the reference phase, either Phase B or ground depending on the service type).

SUMMARY OF THE INVENTION

The above problems are overcome and the advantages of the invention are achieved in methods and apparatus for determining tampering in a multi phase electronic meter. Such meter includes a first processor for determining electrical power from voltage and current signals and for generating an energy signal representative of the electrical energy determination and a second processor for receiving the energy signal and for generating an indication signal representative of said energy signal. It is also preferred for the meter to include a non-volatile memory such as an electrically erasable programmable read only memory connected to the first and second processors, for storing data used by the processors and for storing information generated by the processors. The meter measures the phase difference between two phases in the three-wire wye connection in a network configuration to determine if tampering has occurred.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, in which like references numerals represent similar parts throughout the several views of the drawings, it being understood, however, that the invention is not limited to the specific methods and instrumentalities disclosed. In the drawings.

DETAILED DESCRIPTION OF THE DRAWINGS

Figure 1:
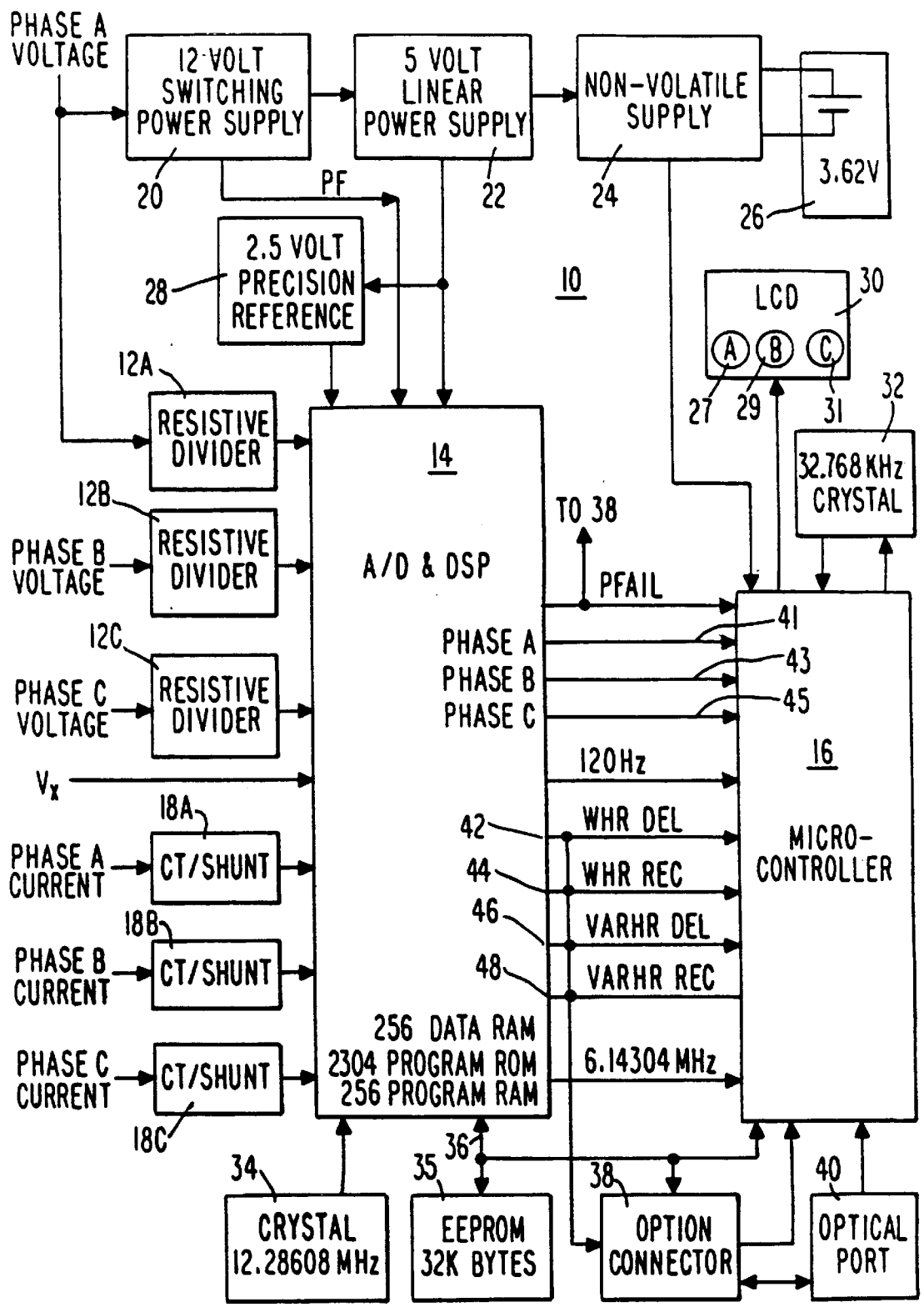
FIG. 1 is a block diagram of an electronic meter constructed in accordance with the present invention.

A new and novel meter for determining loss of reference voltage (indicating possible tampering) in an electronic meter is shown in FIG. 1 and generally designated 10. It is noted at the outset that this meter is constructed so that the future implementation of higher level metering functions can be supported. Such future implementation feature is described in greater detail herein.

FIG. 1 is a block diagram showing the functional components of an exemplary meter and their interfaces in accordance with the present invention. As shown in FIG. 1, a meter for metering three-phase or single phase electrical energy preferably includes a digital LCD type display 30, a meter integrated circuit (IC) 14 which preferably comprises A/D converters and a programmable DSP, and a microcontroller 16.

Analog voltage and current signals propagating over power transmission lines between the power generator of the electrical service provider and the users of the electrical energy are sensed by voltage dividers 12A, 12B, 12C and current transformers or shunts 18A, 18B, 18C, respectively. The outputs of the resistive dividers 12A–12C and current transformers 18A–18C, or sensed voltage and current signals, are provided as inputs to meter IC 14. The A/D converters in the meter IC 14 convert the sensed voltage and current signals into digital representations of the analog voltage and current signals. In a preferred embodiment, the A/D conversion is carried out as described in U.S. Pat. No. 5,544,089 dated Aug. 6, 1996, and entitled PROGRAMMABLE ELECTRICAL METER USING MULTIPLEXED ANALOG-TO-DIGITAL CONVERTERS, assigned to ABB Power T & D Company. The digital voltage and current signals are then input to the programmable DSP in the meter IC 14 for generating pulsed signals 42, 44, 46, 48 representing various power measurements, i.e., each pulse represents the Ke value associated with Watts, VAs, or VARs. These pulsed signals may be processed by the microcontroller 16 to perform revenue metering functions for billing purposes.

The exemplary microcontroller 16, in accordance with the present invention, performs numerous revenue metering functions, as well as instrumentation functions. Instrumentation functions, in contrast to revenue functions, are intended to assist a technician in evaluating a service based on near-instantaneous conditions at the meter. Instrumentation measurements may include system parameters such as frequency, Watts, VARs, and VAs, and per phase information such as voltage, current, phase angles, power factor, current to voltage angle, kWatts, kVARs, kVA, and harmonic distortion related parameters.

The meter IC 14 and the microcontroller 16 each preferably interface with one or more memory devices through an IIC bus 36. An EEPROM 35 is provided to store revenue data as well as programs and program data. Upon power up after installation, a power failure, or a data altering communication, for example, selected programs and program data stored in the EEPROM 35 may be downloaded to the program RAM and data RAM associated with the meter IC 14, as shown in FIG. 1. The DSP under the control of the microcontroller 16 processes the digital voltage and current signals in accordance with the downloaded programs and data stored in the respective program and data RAM.

To perform instrumentation functions, the microcontroller 16 may use voltage and current, real and apparent energy with lead/lag indication, frequency, and relative voltage or current phase angle information from the DSP. According to a preferred embodiment of the present invention, the meter IC 14 monitors the digital phase voltage signals and phase current signals over two line cycles (at about 50 or 60 Hz, two line cycle measurements are defined herein as RMS measurements even though they are "near-instantaneous") and then computes the RMS voltage and current values, real and apparent energies with lead/lag indication, average frequency, or relative voltage or current phase angle information. It should be understood that the number of line cycles is preferably programmable and a different number of line cycles, such as one line cycle for example, may be used for designated measurements. The RMS parameters are computed for a single phase at a time and stored in the data RAM in IC 14. The microcontroller 16 polls for data in these registers via the IIC bus 36 for requested instrumentation measurement. Because the instrumentation measurements are near-instantaneous, no values are stored other than the ones presently being requested.

The DSP in the meter IC 14 also drives potential indicators lines 41, 43, and 45. Microcontroller 16 echoes the line states to potential indicators 27, 29, and 31 which are preferably designated sections on the LCD 30. Potential indicators for each phase remain lit for as long as the corresponding phase potential is present. Phase A, 13, and C potential signals are output from the meter IC 14 to the microcontroller 16, which in turn drives the potential indicators 27, 29, and 31 so that the potential indicator remains lit when the corresponding potential signals are high.

The present invention preferably utilizes three display modes for the LCD 30, namely, normal, alternate, and test modes. On power-up following installation, at a preset time, or following a data altering communication, programmably designated tests are preferably executed. Following the tests, in the normal display mode, in a preferred embodiment, the meter sequentially and continuously scrolls through display items selected for the normal display mode. The display items may include both revenue data and instrumentation parameters.

The present invention may be preprogrammed for use with a designated service or it may determine the service using a service test. The service may be locked, i.e., the service information is stored in the EEPROM 35, manually or automatically.

When the service type is known in advance and locked, the service test preferably checks to ensure that each element is receiving phase potential and that the phase angles are within a predetermined percentage of the nominal phase angles for the known service. The per-phase voltages are also measured and compared to the nominal service voltages to determine whether they are within a predefined tolerance range of the nominal phase voltages. If the voltages and phase angles are within the specified ranges, the phase rotation, the service voltage, and service type are displayed on the meter display. If either a valid service is not found or the service test for a designated service fails, a system error code indicating an invalid service is displayed and locked on the display to ensure that the failure is noted and evaluated to correct the error.

The exemplary meter according to the present invention also provides for remote meter reading, remote power quality monitoring, and reprogramming through an optical port 40 and/or an option connector 38. Although optical communications may be used in connection with the optical port 40, the option connector 38 may be adapted for RF communications or electronic communications via modem, for example.

When an abnormal condition is detected by the meter 10, warnings may be time and date stamped and logged in an event log and the number of events and cumulative time of the conditions may be separately logged in an occurrence log. The logs are preferably stored in the EEPROM 35 shown in FIG. 1. The information stored in these logs may be accessed through software for further diagnostic processing and evaluation external to the meter itself.

Figure 5:
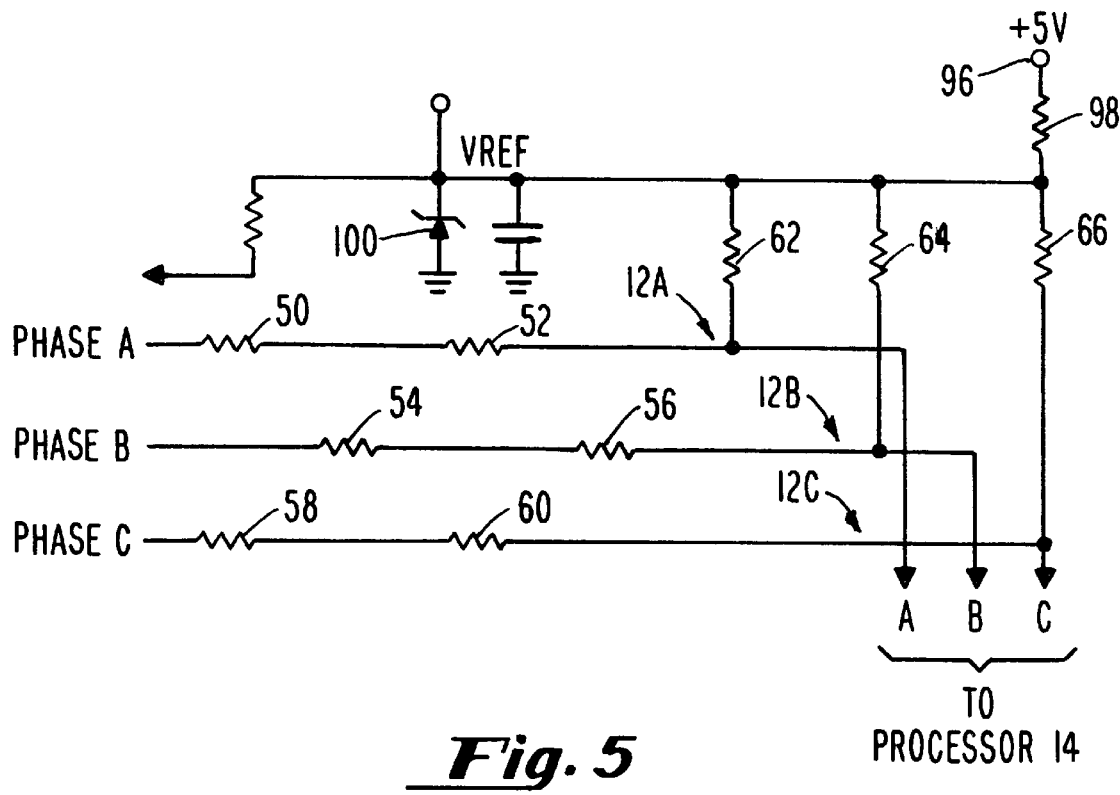
FIG. 5 is a schematic diagram of the resistive dividers and precision reference disclosed in FIG. 1.

Referring briefly to FIG. 5, each resistive divider consists of two 1 Meg, ½ watt resistors 50/52, 54/56 and 58/60, respectively, that are used to drop the line voltage at an acceptable watt loss in combination with respective a third resistor 62, 64 and 66, which acts as a sense resistor. Resistors 62–66 are metal film resistors having a maximum temperature coefficient of 25 ppmn/ C. This combination is very inexpensive compared to other voltage sensing techniques. Resistors 50–60 have an operating voltage rating of 300 Vrms each. These resistors have been individually tested with the 6 kV IEEE 587 impulse waveforms to assure that the resistance is stable and that the devices are not destroyed. Resistors 62–66 scales the input voltage to be less than 1 Volt peak to peak to processor 14. It is noted that resistors 62–66 can be in a range from about 100 ohms to about 1 k ohms in order to assure this maximum peak to peak voltage and still maintain maximum signal.

On grounded, three wire delta systems, those components of the electronics assembly operating on logic voltage levels (including the battery connector) can be at an elevated voltage. In such situations, the two, 1 Meg resistor combinations (50/52, 54/56, 58/60) provide current limiting to the logic level electronics. The worse case current occurs during testing of a 480 V, 3 wire delta meter with single phase excitation.

It will be appreciated that energy units and power consumption are calculated primarily from multiplication of voltage and current. The specific formulae utilized in the preferred embodiment, are listed in Table 1. It should be noted that the present embodiment provides a wide range of voltage operation. This especially preferred embodiment allows four wire delta applications to be metered using a four wire wye meter executing the four wire wye equations in Table 1. However, for purposes of FIG. 2, such formulae are performed in processor 14.

Figure 2:
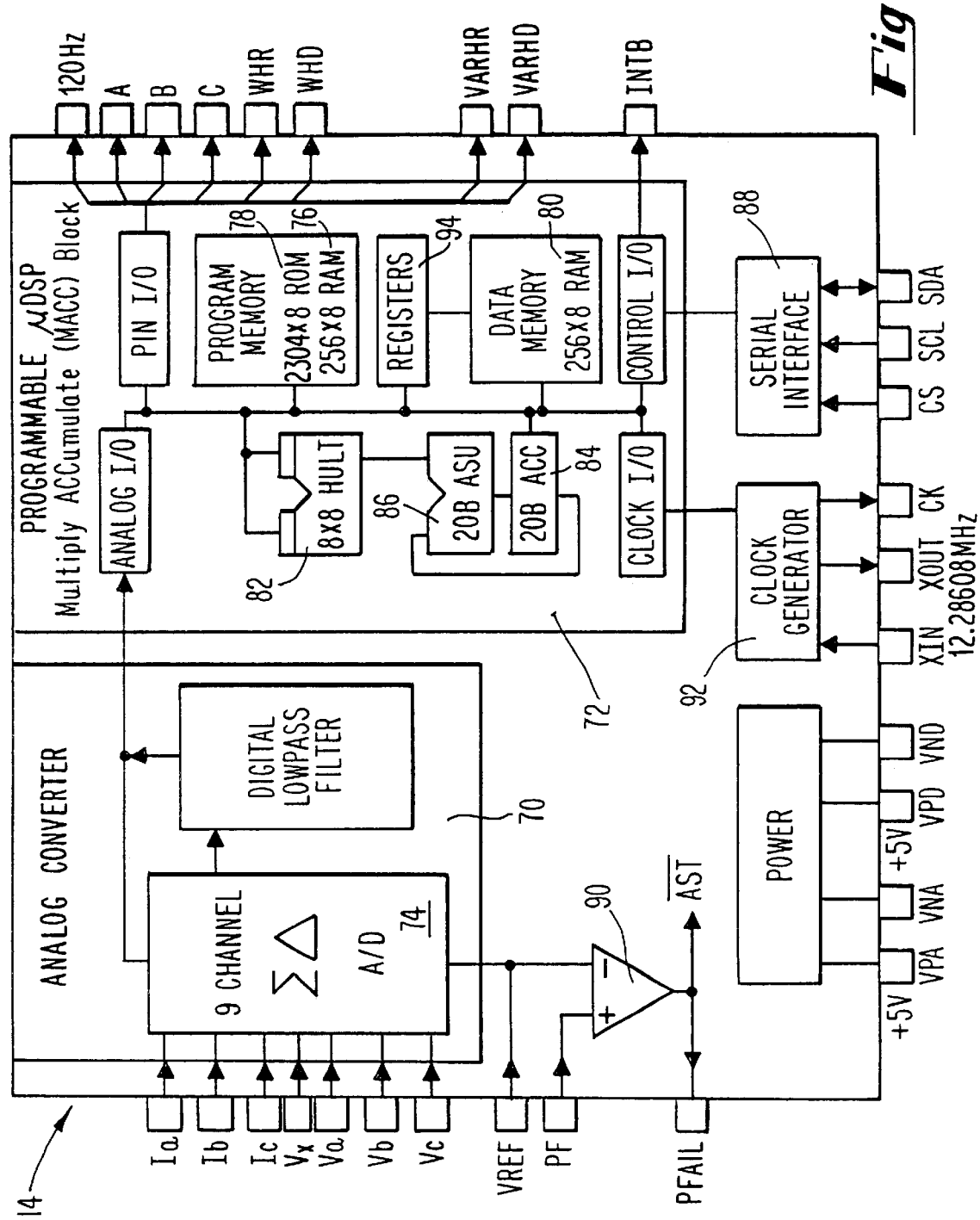
FIG. 2 is a block diagram of the Analog-to-Digital/Digital Signal Processor shown in FIG. 1.

Referring now to FIG. 2, processor 14 includes an analog converter 70 and a programmable DSP 72. Converter 70 includes, three three-channel, over-sampled, 2nd order, sigma-delta A/D converters, depicted as a 9 channel $\Sigma\Delta$ analog-to-digital converter 74. The 12.28608 MHz clock signal is divided by 6 such that each AID samples its input at 2.04768 MHz. Each A/D performs a 96:1 reduction or averaging for each input that results in an effective sample rate of 2.4 kHz on each of the three inputs per AID. The resolution of these samples is equivalent to 21 bits, plus sign. It is noted that such a $\Sigma\Delta$ analog-to-digital conversion scheme results in a correct convergence by each AID for each sample converted. It is recognized that the bandwidth for such a conversion scheme is relatively small, however, the frequency of the voltage and current being converted is also relatively small.

In the preferred embodiment, the three voltage inputs, $V_A$, $V_B$ and $V_C$ are sampled by one of the A/Ds and the three current inputs $I_A$, $I_B$ and $I_C$ are sampled by a second A/D. The third A/D is used to sample either the voltage or current input of the B phase. Such sampling of the voltage or current input of the B phase is done because so-called 2½ element meters require the combination of the B phase current with one or both of the other phase currents. In addition, so-called two element meters require the B phase voltage to be combined with the other phase voltages to produce the line to line voltage. Having a third A/D enables these terms to be sampled simultaneously, thereby improving the measurement accuracy. This also improves the signal to noise ratio within processor 14.

DSP 72 is a reduced instruction set processor (RISC) which computes the desired energy quantities from the converted voltage and current samples. DSP 72 is shown to include a random access memory (RAM) memory 76 having a capacity of 256 bytes of data. Memory 76 is used to store computations and the subroutine stack. A read only memory (ROM) 78 is also shown and has a capacity of 2304 bytes of data. Memory 78 is used to store those metering subroutines common to all energy calculation. Another RAM memory 80 is depicted and has a capacity of 256 bytes of data. Memory 80 is used to store the main line program and specialized subroutines of DSP 72.

DSP 72 is also shown to include multiplier 82 and an accumulator 84 for processing the voltage and current digital signals thereby generating electrical energy information. There is also included arithmetic subtraction unit 86 interposed between multiplier 82 and accumulator 84.

From the foregoing, it should be appreciated that program ROM, i.e., memory 76 is defined at the oxide via level. As this defining step occurs relatively late in the manufacturing process for processor 14, changes can be made to such programming with minimal effort.

Calibration constants for each phase and certain potential linearization constants are stored in memory 80. Memories 76 and 80 are serially down-loaded from EEPROM 35 by microcontroller 16 on power-up of meter 10. Such an embodiment allows the benefit of being able to provide various meter forms economically, to calibrate without hardware modification, and permits the future addition of metering VAR or VA based on the per phase Vrms and Inns. The formulae for such operations are included in Table 1. Furthermore, the calculation of future, yet undefined, complex metering quantities could be obtained by merely reprogramming processor 14.

Processor 14 also contains a crystal oscillator (not shown), serial interface 88, power fail detect circuitry 90, and potential present outputs B and C. The crystal oscillator requires an external 12.28608 MHz crystal oscillator 34. Processor 14 uses this frequency directly for driving the DSP and indirectly for the AID sampling. This frequency is also operated upon by clock generator 92 which serves to divide the output of oscillator 34 (input to processor 14 at XIN and XOUT) by 4, to buffer the divided clock signal and to output the divided clock signal at CK to processor 16 as its clock. This clock output is specified to work down to a supply voltage of 2.0 VDC.

Serial interface 88 is a derivation of the Signetics IIC bus. One serial address is assigned to processor 14. This address accesses one of the four DSP control registers. All information must pass through DSP data register 94 after writing the DSP address register. All memory, registers, and outputs of processor 14 can be read serially. A chip select line CS has been added to disable the communications buffer. The input CS is connected to and controlled by processor 16.

Power fail detection circuit 90 is a comparator which compares a divided representation of the supply voltage to a precision reference. The comparator's output at A concurrently provides a power fail signal and an indication of the presence of phase A ($V_A$) voltage. Upon power fail, it is preferable to reset processor 14. In such a situation, the output pins Whr, Whd, etc. are forced to logic low voltage levels. Additionally, processor 14 goes into a lower power mode to reduce the current draw on power supply 20. In this lower power mode the comparator and oscillator operation are not affected, but DSP 72 ceases to operate.

The power failure voltage PF is generated by dividing the output of supply 22 to generate a voltage which is slightly greater than 2.5V. In the preferred embodiment, a resistor voltage divider provides PF. Since PF is generated in relation to the Phase A voltage (FIG. 1), its presence is an indication that the Phase A voltage is also present.

Figure 7A:
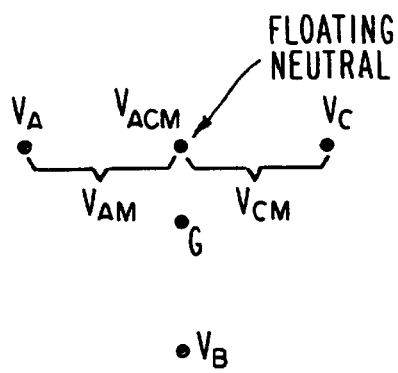
FIGS. 7A and 7D are diagrams illustrating connections and voltages magnitudes for a meter having a connection removed in a three wire wye network connection.

In order to appreciate how the reference voltage is generated consider FIG. 7. There is shown in greater detail the components included in linear power supply 22. The 5V output of supply 22 is provided at 96 in FIG. 5. Resistor 98 and diode 100 combine to generate a precision 2.5V reference voltage. It is noted at this point that $V_A$, $V_B$, $V_C$, $I_A$, $I_B$ and $I_C$ are each provided to processor 14 in reference to VREF.

Consider again processor 14 as shown in FIG. 2. The phase B ($V_B$) and C ($V_C$) potential indicators outputs are under control of DSP 72. The B output is normally a logic level output. The C output also provides the power line time base function (note that phase C is present in all applications). To minimize noise at the power line fundamental, this time base is at two times the power line fundamental.

Referring again to FIG. 1, the M38208 microcontroller 16 is a 6502 (a traditional 8 bit microprocessor) derivative with an expanded instruction set for bit test and manipulation. This microcontroller includes substantial functionality including internal LCD drivers (128 quadraplexed segments), 32 kBytes of ROM, 1 kbytes of RAM, a fill duplex hardware UART, 5 timers, dual clock inputs (32.768 kHz and up to 8 MHz), and a low power operating mode.

During normal operation, processor 16 receives the 6.14304 MHz clock from processor 14 as described above. Upon power fail, processor 16 shifts to the 32.768 kHz crystal oscillator 32. This allows low power operation with a cycle time of 16.384 kHz. During a power failure, processor 16 keeps track of time by counting seconds and rippling the time forward. Once processor 16 has rippled the time forward, a WIT instruction is executed which places the unit in a mode where only the 32.768 kHz oscillator and the timers are operational. While in this mode a timer is setup to "wake up" processor 16 every 32,768 cycles to count a second.

Consider now the main operation of processor 16 in relation to FIGS. 3A–3E and FIG. 4. At step 1000 a reset signal is provided to microcontroller 16. As will be appreciated in relation to the discussion of FIG. 5, a reset cycle occurs whenever the voltage level $V_{dd}$ rises through approximately 2.8 volts. Such a condition occurs when the meter is first powered up.

At step 1002, microcontroller 16 performs an initialize operation, wherein the stack pointer is initialized, the internal RAM is initialized, the type of liquid crystal display is entered into the display driver portion of microcontroller 16 and timers which require initialization at power up are initialized. It will be noted that the operation of step 1002 does not need to be performed for each power failure occurrence. Following a power failure, microcontroller 16 at step 1004 returns to the main program at the point indicated when the power returns.

Upon initial power up or the return of power after a power failure, microcontroller 16 performs a restore function. At step 1006, microcontroller 16 disables pulses transmitted by processor 14. These pulses are disabled by providing the appropriate signal restore bit. The presence of this bit indicates that a restore operation is occurring and that pulses generated during that time should be ignored. Having set the signal restore bit, microcontroller 16 determines at step 1008 whether the power fail signal is present. If the power fail signal is present, microcontroller 16 jumps to the power fail routine at 1010. In the power fail routine, the output ports of microcontroller 16 are written low unless the restore bit has not been set. If the restore bit has not been set, data in the microcontroller 16 is written to memory.

If the power fail signal is not present, microcontroller 16 displays segments at step 1012. At this time, the segments of the display are illuminated. At 1014, the UART port and other ports are initialized at 1016, the power fail interrupts are enabled such that if a falling edge is sensed from output A of processor 14, an interrupt will occur indicating power failure. It will be recalled that processor 14 compares the reference voltage VREF to a divided voltage generated by the power supply 20. Whenever the power supply voltage falls below the reference voltage a power fail condition is occurring.

At step 1018, the downloading of the metering integrated circuit is performed. Such downloading operation is described in greater detail in relation to FIG. 4. At step 1020, the timer interrupts are enabled. It will be appreciated that certain tasks performed by microcontroller 16 are time dependent. Such tasks will require a timer interrupt when the time for performing such tasks has arrived.

At 1022, the self-test subroutines are performed. Although no particular self-tests subroutine is necessary in order to practice the present invention, such subroutines can include a check to determine if proper display data is present. It is noted that data is stored in relation to class designation and that a value is assigned to each class such that the sum of the class values equals a specified number. If any display data is missing, the condition of the class values for data which is present will not equal the specified sum and an error message will be displayed. Similarly, microcontroller 16 compares the clock signal generated by processor 14 with the clock signal generated by watch crystal 32 in order to determine whether the appropriate relationship exists.

Having completed the self-test subroutines, the RAM is re-initialized at 1024. In this re-initialization, certain load constants are cleared from memory. At 1026, various items are scheduled. For example, the display update is scheduled so that as soon as the restore routine is completed, data is retrieved and the display is updated. Similarly, optical communications are scheduled wherein microcontroller 16 determines whether any device is present at optical port 40, which device desires to communicate. Finally, at 1028 a signal is given indicating that the restore routine has been completed. Such a signal can include disabling the signal restore bit. Upon such an occurrence, pulses previously disabled will now be considered valid. Microcontroller 16 now moves into the main routine.

At 1030, microcontroller 16 calls the time of day processing routine. In this routine, microcontroller 16 looks at the one second bit of its internal and determines whether the clock needs to be changed. For example, at the beginning and end of Daylight Savings Time, the clock is moved forward and back one hour, respectively. In addition, the time of day processing routine sets the minute change flags and date change flags. As will be appreciated hereinafter, such flags are periodically checked and processes occur if such flags are present.

It will be noted that there are two real time interrupts scheduled in microcontroller 16 which are not shown in FIG. 3, namely the roll minute interrupt and the day interrupt. At the beginning of every minute, certain minute tasks occur. Similarly, at the beginning of every day, certain day tasks occur. Since such tasks are not necessary to the practice of the presently claimed invention, no further details need be provided.

At 1032, microcontroller 16 determines whether a self-reprogram routine is scheduled. If the self-reprogram routine is scheduled, such routine is called at 1034. The self-reprogram typically programs in new utility rates which are stored in advance. Since new rates have been incorporated, it will be necessary to also restart the display. After operation of the self-reprogram routine, microcontroller 16 returns to the main program. If it is determined at 1032 that the self-reprogram routine is not scheduled, microcontroller 16 determines at 1036 whether any day boundary tasks are scheduled. Such a determination is made by determining the time and day and searching to see whether any day tasks are scheduled for that day. If day tasks are scheduled, such tasks are called at 1038. If no day tasks are scheduled, microcontroller 16 next determines at 1040 whether any minute boundary tasks have been scheduled. It will be understood that since time of use switch points occur at minute boundaries, for example, switching from one use period to another, it will be necessary to change the data storage locations at such a point. If minute tasks are scheduled, such tasks are called at 1042. If minute boundary tasks have not been scheduled, microcontroller 16 determines at 1044 whether any self-test have been scheduled. The self-tests are typically scheduled to occur on the day boundary. As indicated previously, such self-tests can include checking the accunulative display data class value to determine whether the sum is equal to a prescribed value. If self-tests are scheduled, such tests are called at 1046. If no self-tests are scheduled, microcontroller 16 determines at 1048 whether any season change billing data copy is scheduled. It will be appreciated that as season changes billing data changes. Consequently, it will be necessary for microcontroller 16 to store energy metered for one season and begin accumulating energy metered for the following season. If season change billing data copy is scheduled, such routine is called at 1050. If no season change routine is scheduled, microcontroller 16 determines at 1052 whether the self-redemand reset has been scheduled. If the self-redemand reset is scheduled, such routine is called at 1054. This routine requires microcontroller 16 to in effect read itself and store the read value in memory. The demand reset is then reset. If the self-demand reset has not been scheduled, microcontroller 16 determines at 1056 whether a season change demand reset has been scheduled. If a season change demand reset is scheduled, such a routine is called at 1058. In such a routine, microcontroller 16 reads itself and resets the demand.

At 1060, microcontroller 16 determines whether button sampling has been scheduled. The buttons to be sampled are positioned on the face of meter 10. Button sampling will occur every eight milliseconds. Consequently, if an eight millisecond period has passed, microcontroller 16 will determine that button sampling is scheduled and the button sampling routine will be called at 1062.

If button sampling is not scheduled, microcontroller 16 determines at 1064 whether a display update has been scheduled. This routine causes a new quantity to be displayed on LCD 30. As determined by the soft switch settings mentioned above, display updates are scheduled generally for every three-six seconds. If the display is updated more frequently, it may not be possible to read the display accurately. If the display update has been scheduled, the display update routine is called at 1066.

If a display update has not been scheduled, microcontroller 16 determines at 1068 whether an annunciator flash is scheduled. It will be recalled that certain annunciators on the display are made to flash. Such flashing typically occurs every half second. If an annunciator flash is scheduled, such a routine is called at 1070. If no annunciator flash is scheduled, microcontroller 16 determines at 1072 whether optical communication has been scheduled. It will be recalled that every half second microcontroller 16 determines whether any signal has been generated at optical port. If a signal has been generated indicating that optical communications is desired, the optical communication routine will be scheduled. If the optical communication routine is scheduled, such routine is called at 1074. This routine causes microcontroller 16 to sample optical port 40 for communication activity.

If no optical routine is scheduled, microcontroller 16 determines at 1076 whether processor 14 is signaling an error. If processor 14 is signaling an error, microcontroller 16 at 1078 disables the pulse detection, calls the download routine and after performance of that routine, re-enables the pulse detection. If processor 14 is not signaling any error, microcontroller 16 determines at 1080 whether the download program is scheduled. If the download program is scheduled, the main routine returns to 1078 and thereafter back to the main program.

If the download program has not been scheduled or after the pulse detect has been re-enabled, microcontroller 16 determines at 1082 whether a warmstart is in progress. If a warmstart is in progress, the power fail interrupts are disabled at 1084. The pulse computation routine is called after which the power fail interrupts are re-enabled. It will be noted that in the warmstart data is zeroed out in order to provide a fresh start for the meter. Consequently, the pulse computation routine performs the necessary calculations for energy previously metered and places that computation in the appropriate point in memory. If a warmstart is not in progress, microcontroller 16 at 1084 updates the remote relays. Typically, the remote relays are contained on a board other than the electronics assembly board.

Figure 4:
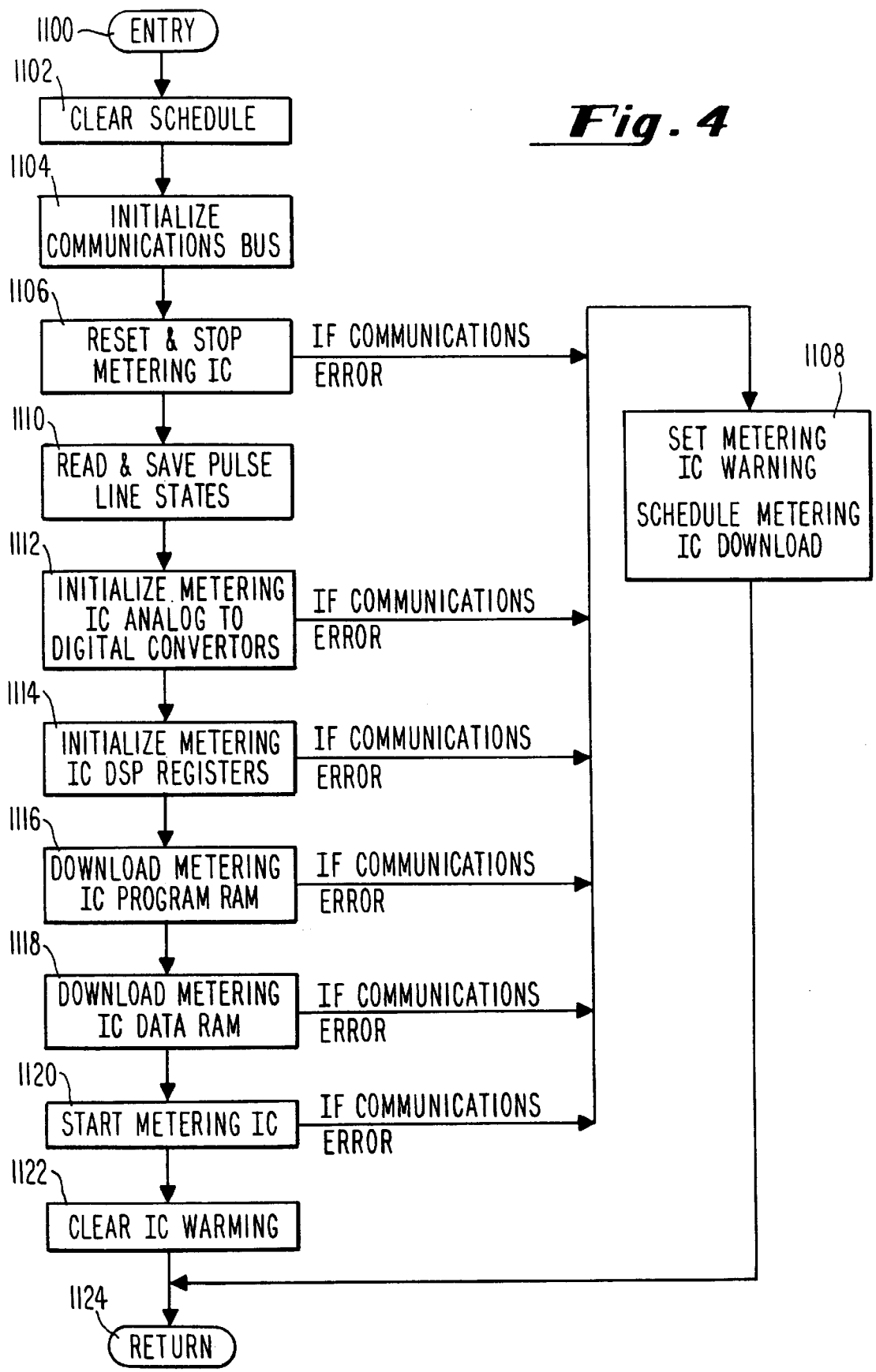
FIG. 4 is a flow chart of the download program utilized by the microcontroller shown in FIG. 1.

Referring now to FIG. 4, the program for downloading processor 14 will be described. At 1100, microcontroller 16 enters the program. At 1102, the schedule indicating that a metering download should take place is cleared. At 1104, Microcontroller 16 initializes the communication bus, which in the preferred embodiment is SCS. At 1106, microcontroller 16 resets and stops processor by way of an interrupt on processor 14. However, if there is a communications error between microcontroller 16 and processor 14, microcontroller 16 at 1108 sets a warning and schedules a download of processor 14. After 1108 the downloading program is terminated, microcontroller 16 returns to the main routine.

At 1110, microcontroller reads and saves the pulse line states. It will be recalled that as processor 14 makes energy determinations, each unit of energy is represented by a logic transition on outputs 42–48 (FIG. 1). At 1110 the state of each output 42–48 is saved. At 1112, microcontroller initializes AID converters 74, if a communication error occurs, microcontroller proceeds to 1108. At 1114 the digital signal processing registers 94 are initialized. At 1116 program memory 78 is downloaded to memory. At 1118, the data memory 80 is downloaded to memory. At 1120, processor 14 is started. If a communication error occurs at any of steps 1114–1120, microcontroller 16 again returns to 1108. At 1122, any warning messages previously set at 1108 are cleared. At 1124, microcontroller 16 returns to its main program.

All data that is considered non-volatile for meter 10, is stored in a 32 kbyte EEPROM 35. This includes configuration data (including the data for memory 76 and memory 80), total kWh, maximum and cumulative demands (Rate A demands in TOU), historic TOU data, cumulative number of demand resets, cumulative number of power outages and the cumulative number of data altering communications. The present billing period TOU data is stored in the RAM contained within processor 16. As long as the microcontroller 16 has adequate power, the RAM contents and real time are maintained and the microcontroller 16 will not be reset (even in a demand register).

As indicated previously, operational constants are stored in EEPROM data. Microcontroller 16 performs checks of these memory areas by adding the class designations for various data and comparing the sum to a reference number. For example, the data class is used to define the 256 byte block of program memory. Appended to the 256 bytes of program in this data class is the DSP code identification, revision number, and the checksum assigned to this data class. The operational constants consist of the calibration constants and data RAM initial values, the meter's secondary Ke and Kh, and information that the microcontroller must use to process the meter's data.

Figure 8:
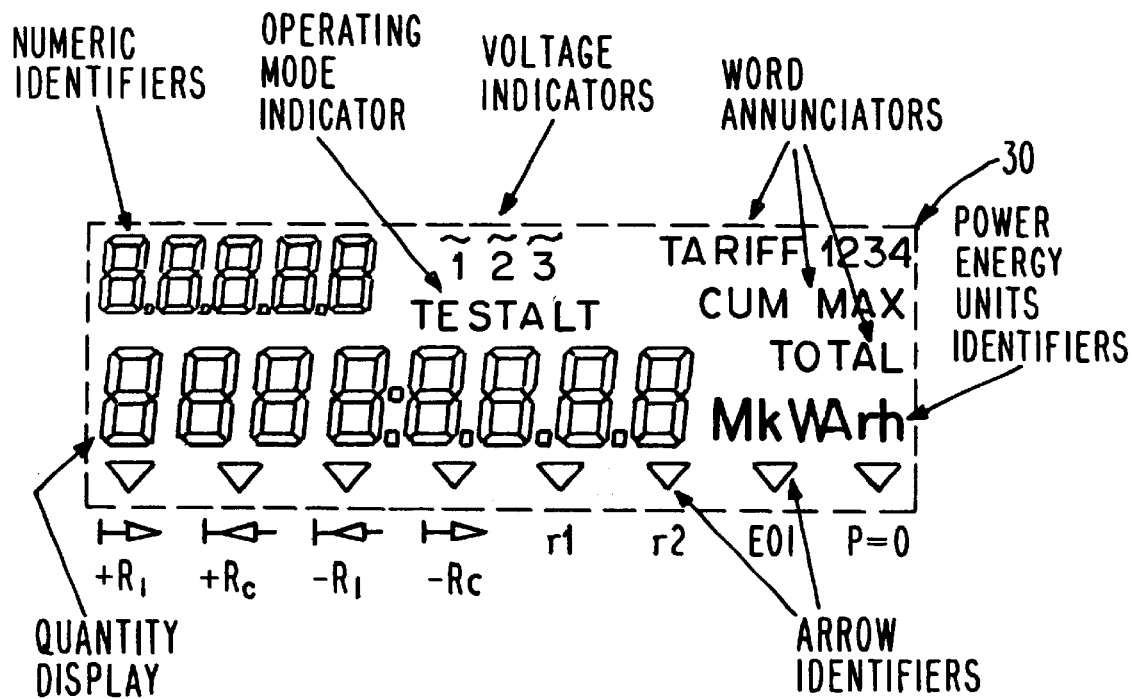
FIG. 8 illustrates a display of the electronic meter of the present invention.

LCD 30 (see also FIG. 8) allows viewing of the billing and other metering data and statuses. Temperature compensation for LCD 30 is provided in the electronics. Even with this compensation, the meter's operating temperature range and the LCD's 5 volt fluid limits LCD 30 to being triplexed. Hence, themaximum number of segments supported in this design is 96. The display response time will also slow noticeably at temperatures below −30 Celsius.

Figures 6A, 6B:
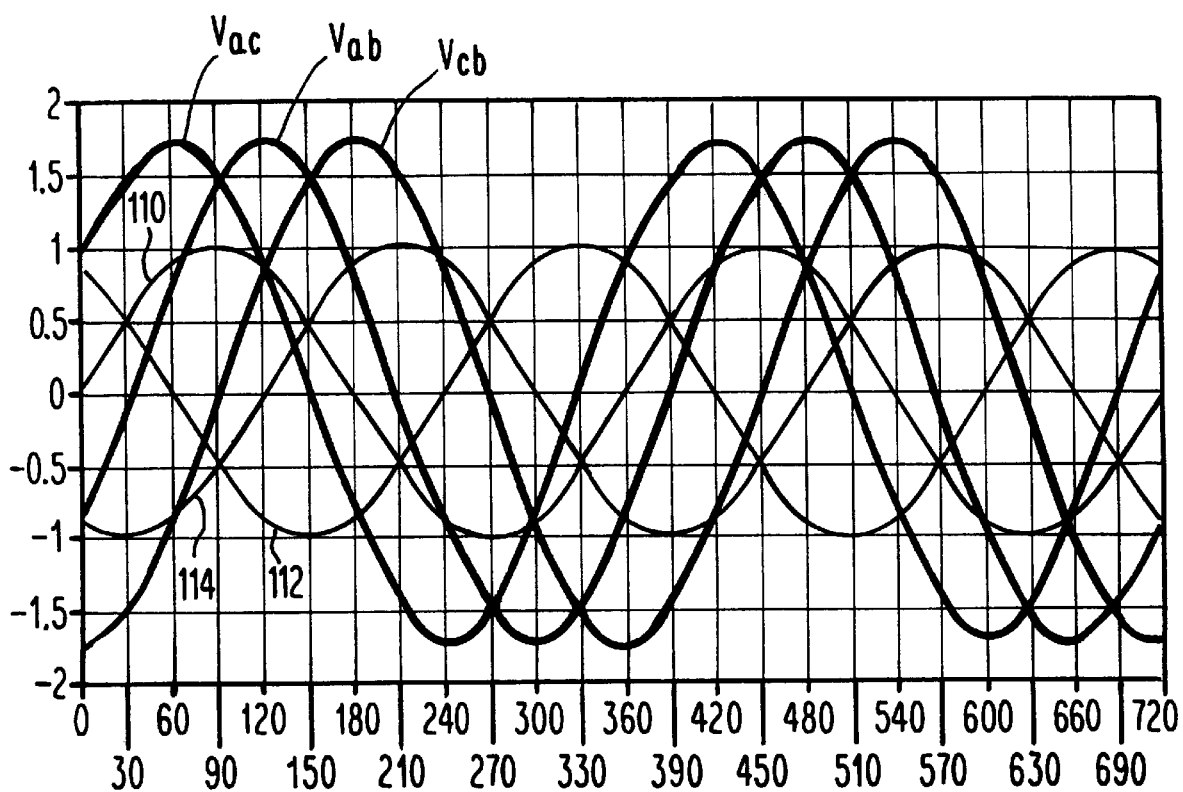
FIGS. 6A and 6B are diagrams illustrating connections and voltages magnitudes for a meter properly connected in a three wire wye network connection.

Referring to FIGS. 6A and 6B, when all wires are properly connected in the three-wire wye network configuration, the actual (and measured) voltages at $V_A$, $V_B$, and $V_C$ are as follows:

$$V_A = \sin\theta \qquad (1)$$

$$V_B = \sin\left(\theta + \frac{2\pi}{3}\right) \qquad (2)$$

$$V_C = \sin\left(\theta + \frac{4\pi}{3}\right) \qquad (3)$$

$V_A$, $V_B$, and $V_C$ are illustrated by waveforms 110, 112 and 114, respectively in FIG. 6B and θ is the angle of each phase.

Equations (1), (2) and (3) noted above each represent the voltages with respect to neutral. In a two-element meter in a three-wire wye network configuration, Phases A ($V_A$) and C ($V_C$) and neutral are connected to the meter, however, phase B ($V_B$) is not connected. Thus, if a wire carrying $V_A$ or $V_C$ is removed, such removal can be easily detected by measuring the voltage amplitude of the phase to neutral. However, because the neutral is normally at ground potential (i.e., zero Volts), there is no voltage drop when that wire is removed.

In the three-wire wye network configuration, when the neutral is removed from the meter, the potential at the point at which the neutral wire should be connection floats at a voltage that is halfway between that of Phase A and Phase C. The meter 10, in turn utilizes this floating voltage as a "common reference ground" from which the voltages at Phase A and Phase C are determined. Mathematically, such a floating neutral ($V_N$) may be expressed as follows:

$$V_N = \frac{1}{2}(V_A + V_C) \qquad (4)$$

Figure 7B:
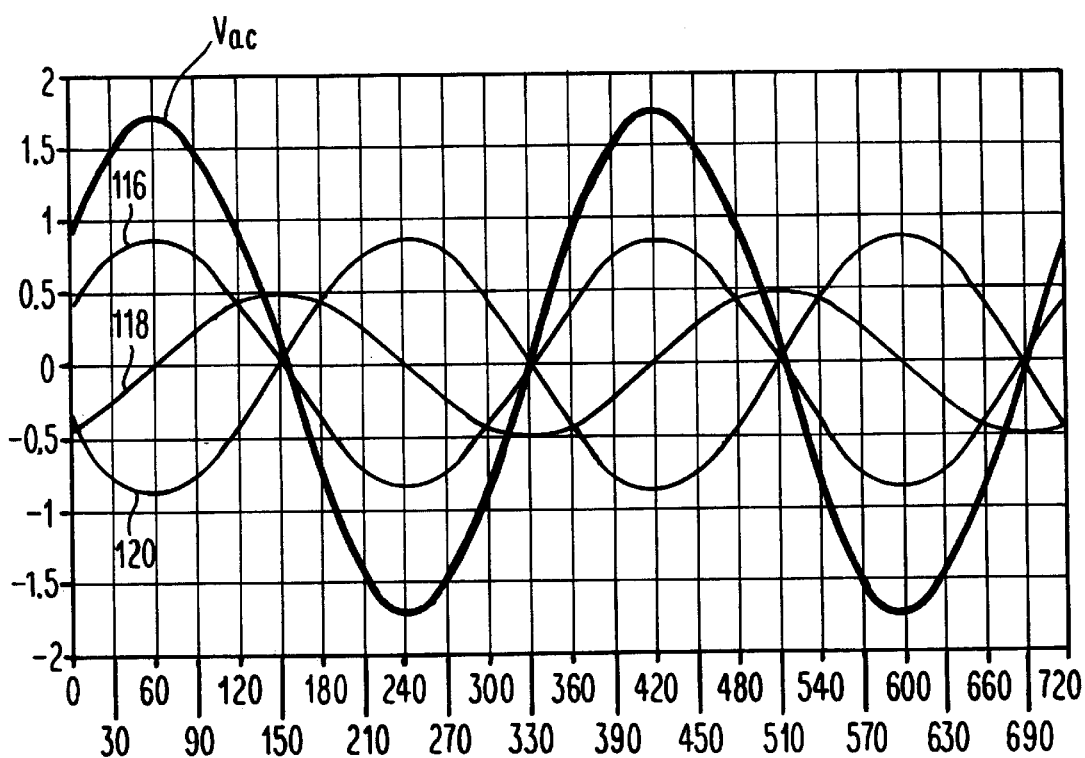

The waveform representative of equation (4) is illustrated as line 118 in FIG. 7B. Solving equation (4) using equations (1) and (2), yields the following:

$$V_N = \frac{1}{2}\left(\sin\theta + \sin\left(\theta + \frac{4\pi}{3}\right)\right) \qquad (5)$$

$$V_N = \frac{1}{2}\left(\sin\theta + \sin\theta\cos4\frac{\pi}{3} + \cos\theta\sin4\frac{\pi}{3}\right)$$

$$V_N = \frac{1}{2}\left(\sin\theta\left(1 + \cos4\frac{\pi}{3}\right) + \cos\theta\sin4\frac{\pi}{3}\right)$$

$$V_N = \frac{1}{2}\left(\sin\theta\left(1 - \frac{1}{2}\right) - \frac{\sqrt{3}}{2}\cos\theta\right)$$

$$V_N = \frac{1}{2}\left(\frac{1}{2}\sin\theta - \frac{\sqrt{3}}{2}\cos\theta\right)$$

$$V_N = \frac{1}{4}\sin\theta - \frac{\sqrt{3}}{4}\cos\theta$$

Equation (5) thus represents the reference voltage that the meter 10 interprets as the neutral voltage $V_N$. As noted above, the meter determines $V_A$ and $V_C$ based on $V_N$, which as is evident from FIG. 7B, is different than ground. Accordingly, the measurements for $V_A$ and $V_C$ will be different than the actual values of these voltages.

The apparent (measured) voltage at Phase A ($V_{AM}$) is determined as follows, and is illustrated as line 116 in FIG. 7B:

$$V_{AM} = V_A - V_N$$

$$V_{AM} = \sin\theta - \frac{1}{4}\sin\theta + \frac{\sqrt{3}}{4}\cos\theta \quad (6)$$

$$V_{AM} = \sin\theta\left(1 - \frac{1}{4}\right) + \frac{\sqrt{3}}{4}\cos\theta$$

$$V_{AM} = \frac{3}{4}\sin\theta + \frac{\sqrt{3}}{4}\cos\theta$$

Similarly, the apparent (measured) voltage at Phase C is determined as follows and is illustrated in FIG. 7B as line 120:

$$V_{CM} = V_C - V_N$$

$$V_{CM} = \sin\left(\theta + \frac{4\pi}{3}\right) - \frac{1}{4}\sin\theta + \frac{\sqrt{3}}{4}\cos\theta \quad (7)$$

$$V_{CM} = \left(\sin\theta\cos\frac{4\pi}{3} + \cos\theta\sin\frac{4\pi}{3}\right) - \frac{1}{4}\sin\theta + \frac{\sqrt{3}}{4}\cos\theta$$

$$V_{CM} = \left(-\frac{1}{2}\sin\theta - \frac{\sqrt{3}}{2}\cos\theta\right) - \frac{1}{4}\sin\theta + \frac{\sqrt{3}}{4}\cos\theta$$

$$V_{CM} = -\frac{3}{4}\sin\theta - \frac{\sqrt{3}}{4}\cos\theta$$

Thus, as is evident by equations (6) and (7), $V_{AM}$ and $V_{CM}$ are identical in magnitude, however, the two voltages are 180 out of phase with respect to each other. With regard to actual the Phase A voltage, the magnitude of the measured Phase A voltage is about 87% of the actual magnitude and lags by 30. This relationship is noted by equation (8) below.

$$V_{AM} = \frac{3}{4}\sin\theta + \frac{\sqrt{3}}{4}\cos\theta \quad (6)$$

$$V_{AM} = \frac{\sqrt{3}}{2}\left(\frac{\sqrt{3}}{2}\sin\theta + \frac{1}{2}\cos\theta\right)$$

$$V_{AM} = \frac{\sqrt{3}}{2}\left(\sin\theta\cos\frac{\pi}{6} + \sin\frac{\pi}{6}\cos\theta\right)$$

$$V_{AM} = \frac{\sqrt{3}}{2}\left(\sin\theta + \frac{\pi}{6}\right) \quad (8)$$

Accordingly:

$$V_{CM} = -\frac{\sqrt{3}}{2}\left(\sin\theta + \frac{\pi}{6}\right) \quad (9)$$

The tamper detection technique of the present invention advantageously utilizes this phase/magnitude relationship of the voltages to determine if a meter for a three-wire wye connection in a network configuration has be subjected to tampering or has been mis-wired. By appropriately adjusting the phase/magnitude relationships noted above, the present invention may be utilized to determine mis-wiring and/or tampering in three-wire delta configurations.

Figure 3A:
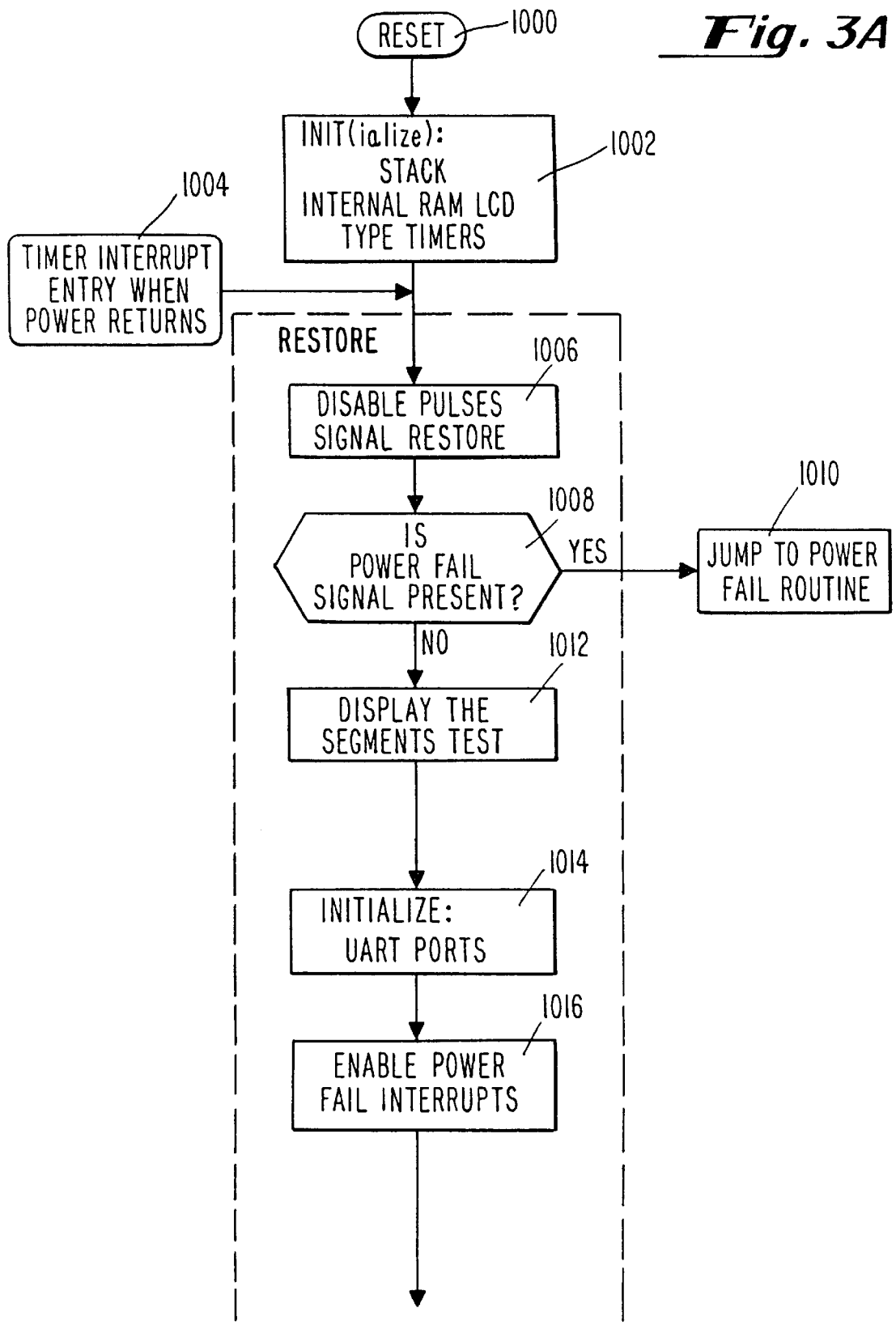
FIGS. 3A–3E combine to provide a flow chart of the primary program utilized by the microcontroller disclosed in FIG. 1.
Figure 3B:
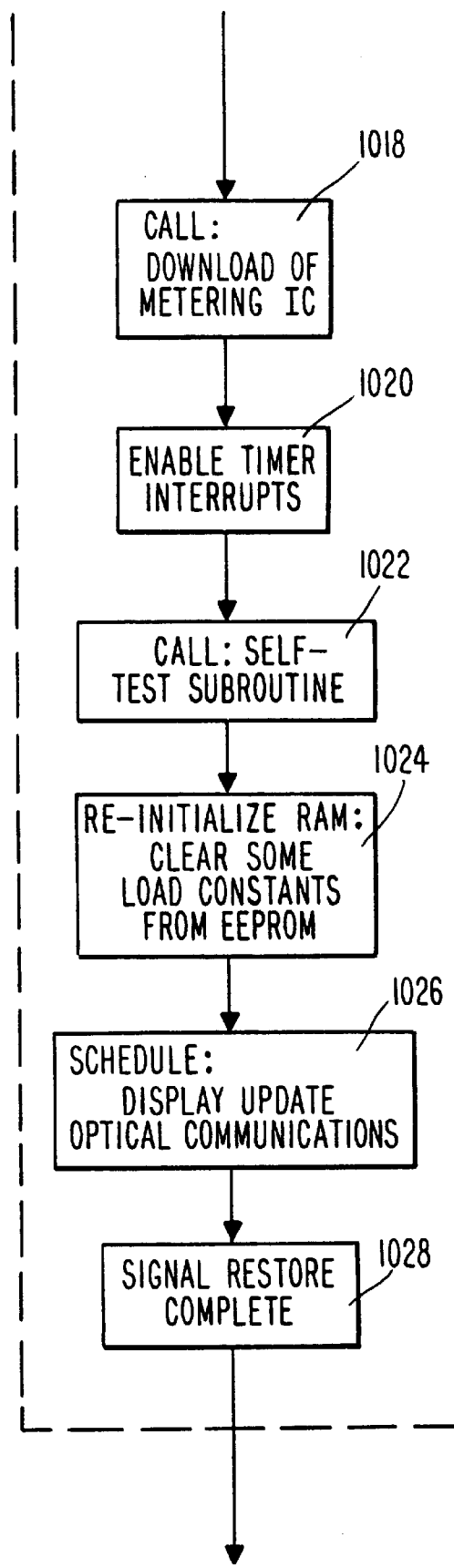
Figure 3C:
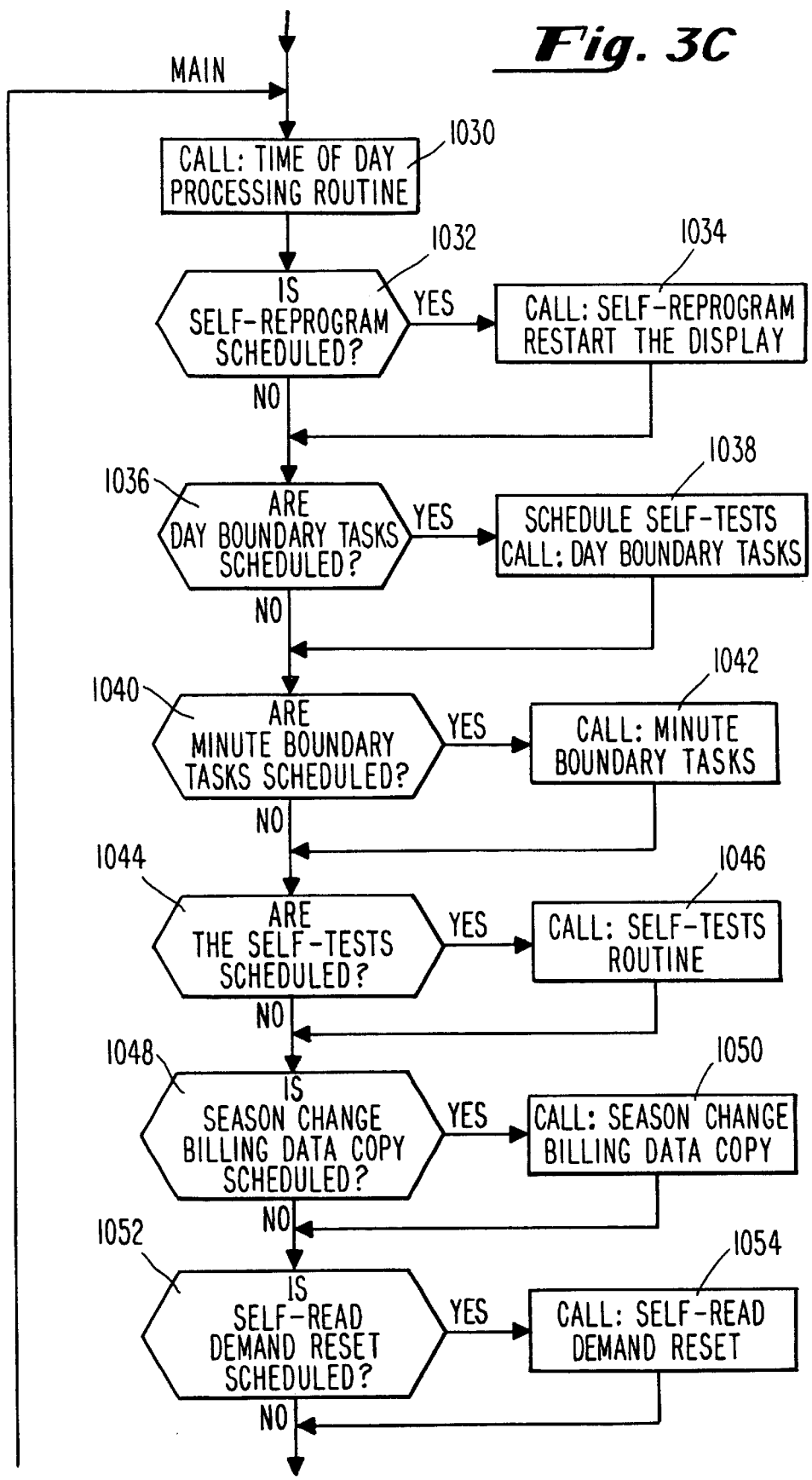
Figure 3D:
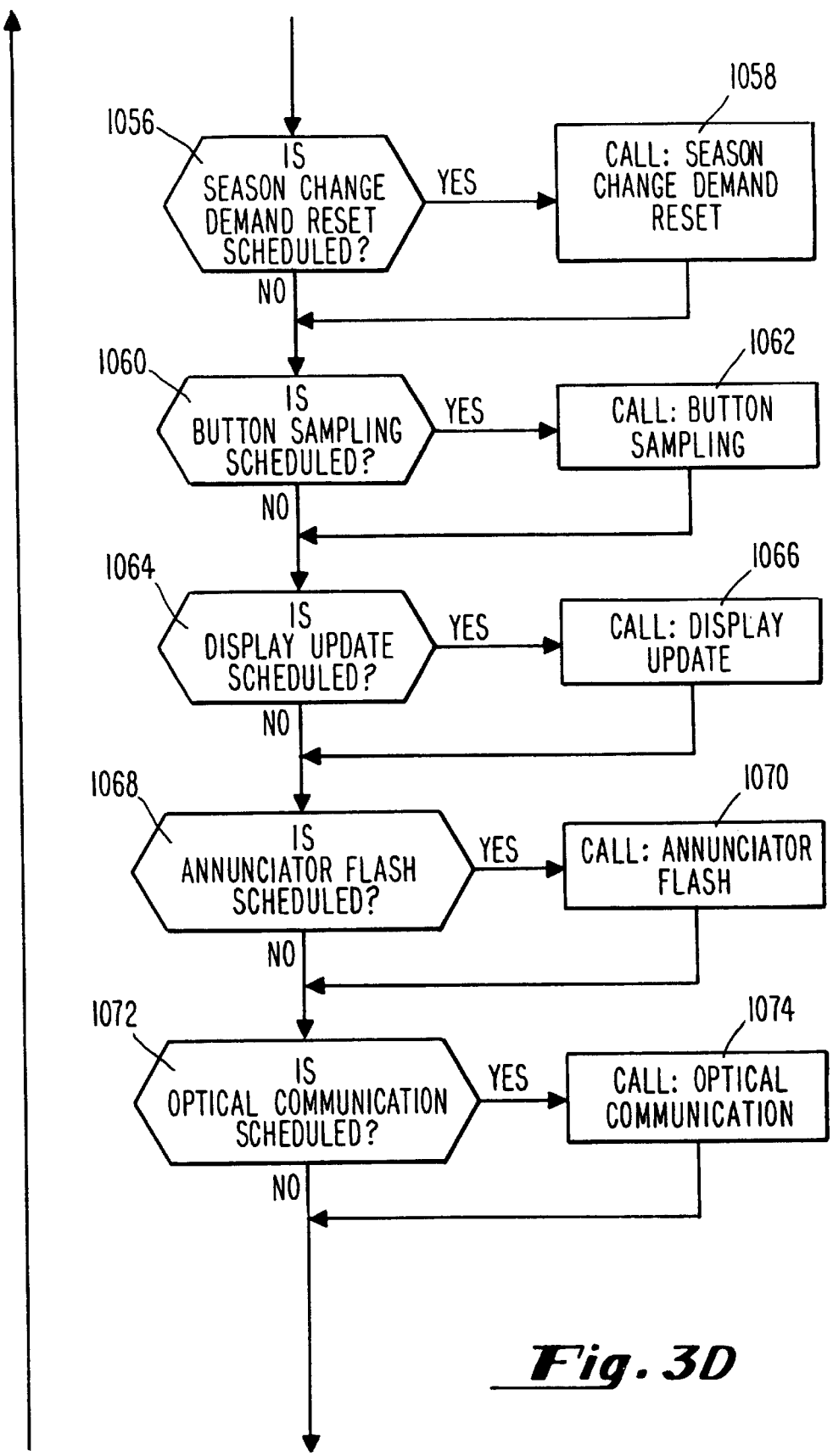
Figure 3E:
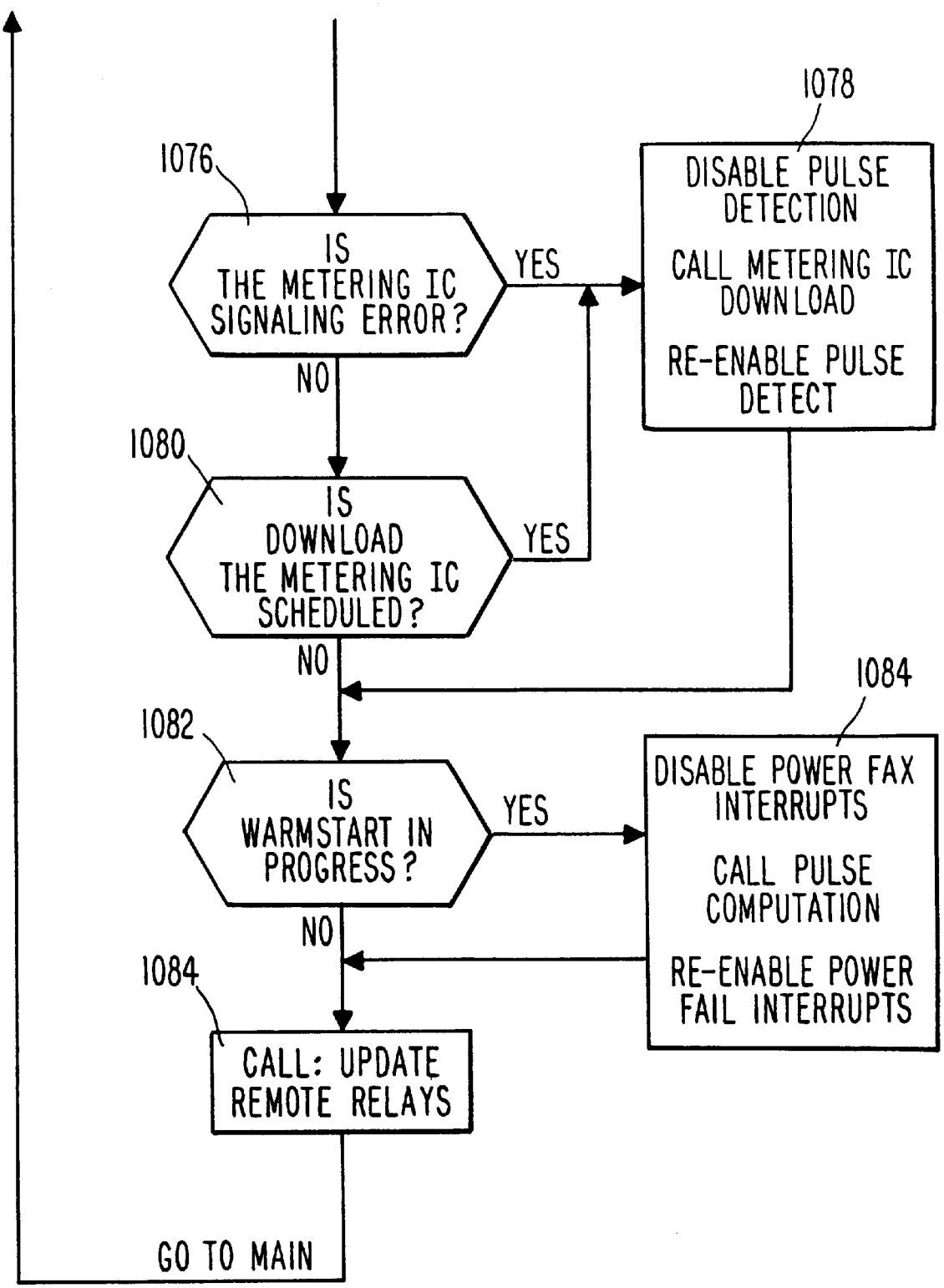
Figure 9:
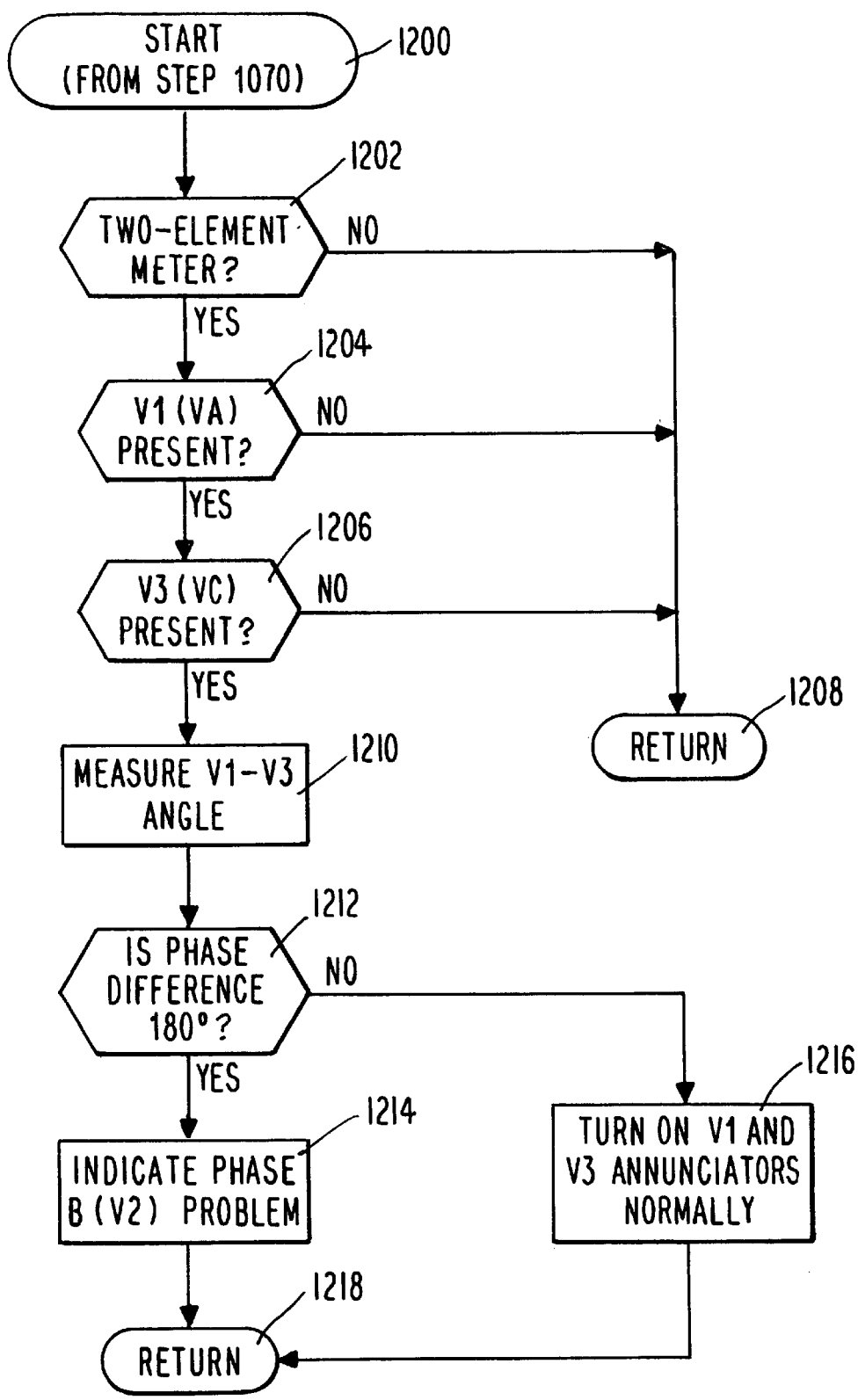
FIG. 9 is a flow chart of the processes performed to determine if tampering has occurred within a meter.

Turning to the implementation of the above relationship within the meter 10, as shown in FIG. 3D, the microcontroller 16 performs an annunciator flash process at step 1070. It is preferable to perform the tamper detection determination of the present invention during this process at step 1070 so that an appropriate indication may be provided by the display 30. In particular, referring to FIG. 9, at step 1200 control is passed from step 1070 (FIG. 3D) to the tamper detection process. At step 1202 it is determined if the meter 10 is configured as a two-element meter. This may be performed by checking the configuration information in the EEPROM 35 or other suitable method. The configuration information may be programmed during the manufacturing of the meter 10. If the meter 10 is not configured as a two-element meter, the process returns at step 1208. Otherwise, at step 1204, it is determined if $V_1$ ($V_A$) is present. To determine if $V_1$ is present, the voltage at Phase A is measured by ADC/DSP 14 and compared to a predetermined threshold value (e.g., 40 Volts). If the voltage meets or exceeds this predetermined value, then it is considered to be present. If the voltage falls below this predetermined value, it is considered not present. If $V_1$ is not present then the process returns at step 1208. If $V_1$ is present, then at step 1206, it is determined if $V_3$ ($V_C$) is present. This determination is performed in a similar manner as noted with regard to $V_1$. If $V_3$ is not present then the process returns at step 1208.

If $V_3$ is present, then at step 1210, then at step 1212 the phase difference between $V_1$ and $V_3$ is determined. If the difference is 180, then at step 1214, the meter 10 will indicate a problem (i.e., tampering) with $V_2$ (Phase B or $V_B$). Such an indication may be performed by, e.g., flashing the $V_2$ annunciator (e.g., 2 shown on LCD 30 in FIG. 8), or indicating a predetermined alphanumeric value in the quantity display of the LCD 30 (e.g., 100FF). If the difference is not 180, then the annunciators on the LCD 30 for $V_1$ and $V_3$ (e.g., annunciators 1 and 3 shown on LCD 30 in FIG. 8) are turned ON at step 1216. It is noted that the determination at step 1212 is preferably made by rounding the result of $V_1$–$V_3$ to the nearest 30 (e.g.,0,±30 ,±60 ,±90 ,±120 ,±150 or ±180) before making the determination if the phase difference is 180. The process then returns at step 1218 to continue through the main loop of FIG. 3.

In addition to the above, at step 1214, a timer may be started within the microcontroller 16 to track the period of time during which the Phase B ($V_2$) problem exists. A date/time stamp may also be stored. The time and date information may be used to bill the customer for usage, and/or prosecution/legal enforcement purposes.

While the above tamper detection technique has been illustrated with respect to Phase B, it is also applicable to Phases A and C or combinations of phases. Furthermore, the concept may also be used in other configurations where the two phase voltages are not normally 180 apart (e.g., 3-wire delta, 4-wire delta, and 4-wire wye services). The meter 10 may be configured to recognize when any one or two phases are removed and will increment a timer for each phase. When the phase is reconnected, the timer will be stopped and the value retained in memory. If tampering should be detected again with respect to that phase, the timer will be restarted from the time stored in memory for that phase. Thus, a cumulative record of outage time will be provided by the meter. A voltage outage log may be kept that retains a partial voltage outage date, a partial voltage outage time, a Phase A cumulative outage time, a Phase B cumulative outage time, and a Phase C cumulative outage time.

The stored value in memory and the voltage outage log may be cleared upon completion of a billing read, or by a clear command to clear the voltage outage log and stored values.

TABLE 1

Meter Formulae

Watt formulae:

$-3: \text{Watts} = K_G(K_A V_{A_0} I_{A_0} + K_B V_{B_1} I_{B_1} + K_C V_{C_2} I_{C_2})$ $-2: \text{Watts} = K_G((K_A V_{A_0} - K_B V_{B_0}) I_{A_0} + (K_C V_{C_2} - K_D V_{B_2}) I_{C_2})$ $-8: \text{Watts} = K_G(K_A V_{A_0} I_{A_0} - (K_B V_{A_0} I_{B_0} + K_D V_{C_2} I_{B_2}) + K_C V_{C_2} I_{C_2})$ $-7: \text{Watts} = K_G(K_A V_{A_0} I_{A_0} - K_B V_{A_0} I_{B_0} + K_C V_{C_2} I_{C_2})$ NOTE: Subscripts refer to the phase of the inputs. Sub-subscripts refer to the A/D cycle in which the sample is taken. Va for −7 applications is actually line to neutral.

VA Formulae:

$-3: VA = K_G(K_A V_{A_0 rms} I_{A_0 rms} + K_B V_{B_1 rms} I_{B_1 rms} + K_C V_{C_2 rms} I_{C_2 rms})$ $-2: VA = K_G((K_A V_{A_0} - K_B V_{B_0})_{rms} I_{A_0 rms} + (K_C V_{C_2} - K_D V_{B_2})_{rms} I_{C_2 rms})$ $-8: VA = K_G\left(K_A V_{A_0 rms} I_{A_0 rms} + \frac{(K_B V_{A_0 rms} + K_d V_{C_2 rms})}{2} I_{B_0 rms} + K_C V_{C_2 rms} I_{C_2 rms}\right)$ $-7: VA = K_G(K_A V_{A_0 rms} I_{A_0 rms} + K_B V_{A_0 rms} I_{B_0 rms} + K_C V_{C_2 rms} I_{C_2 rms})$ RMS measurements are made over one line cycle and preferably begin at the zero crossing of each voltage.

VAR Formula:

$$VAR = \sqrt{VA_{A^2} - Watt_{A^2}} + \sqrt{VA_{B^2} - Watt_{B^2}} + \sqrt{VA_{C^2} - Watt_{C^2}}$$

where the subscripts are associated with the I terms of Watts and VAs and the calculation is performed every cycle as shown below:

$-3: VAR = K_G\left(K_A \sqrt{(V_{A_0 rms} I_{A_0 rms})^2 - \left(\sum_{zero}^{cycle} V_{A_0} I_{A_0}\right)^2} + K_B \sqrt{(V_{B_1 rms} I_{B_1 rms})^2 - \left(\sum_{zero}^{cycle} V_{B_1} I_{B_1}\right)^2} + K_C \sqrt{(V_{C_2 rms} I_{C_2 rms})^2 - \left(\sum_{zero}^{cycle} V_{C_2} I_{C_2}\right)^2}\right)$ $-2: VAR = K_G\left(\sqrt{((K_A V_{A_0} - K_B V_{B_0})_{rms} I_{A_0 rms})^2 - \left(\sum_{zero}^{cycle}(K_A V_{A_0} - K_B V_{B_0}) I_{A_0}\right)^2} + \sqrt{((K_C V_{C_2} - K_D V_{B_2})_{rms} I_{C_2 rms})^2 - \left(\sum_{zero}^{cycle}(K_C V_{C_2} - K_D V_{B_2}) I_{C_2}\right)^2}\right)$ $-8: VAR = K_G\left(K_A \sqrt{(V_{A_0 rms} I_{A_0 rms})^2 - \left(\sum_{zero}^{cycle} V_{A_0} I_{A_0}\right)^2} + \sqrt{\left(\frac{1}{2}(K_B V_{A_0 rms} + K_D V_{C_2 rms}) I_{B_0 rms}\right)^2 - \left(\sum_{zero}^{cycle}(K_B V_{A_0} I_{B_0} + K_D V_{C_2} I_{B_2})\right)^2} + K_C \sqrt{(V_{C_2 rms} I_{C_2 rms})^2 - \left(\sum_{zero}^{cycle} V_{C_2} I_{C_2}\right)^2}\right)$ $-7: VAR = K_G\left(K_A \sqrt{(V_{A_0 rms} I_{A_0 rms})^2 - \left(\sum_{zero}^{cycle} V_{A_0} I_{A_0}\right)^2} + K_B \sqrt{(V_{A_0 rms} I_{B_0 rms})^2 - \left(\sum_{zero}^{cycle} V_{A_0} I_{B_0}\right)^2} + K_C \sqrt{(V_{C_2 rms} I_{C_2 rms})^2 - \left(\sum_{zero}^{cycle} V_{C_2} I_{C_2}\right)^2}\right)$ For purposes of the above formulae, the following definitions apply:

−2 means a 2 element in 3 wire delta application;
−3 means a 3 element in 4 wire wye application;
−8 means a 2½ element in 4 wire wye application;
−5 means a 2 element in 3 wire delta application;
−7 is a 2½ element in 4 wire delta application.

It is noted that the foregoing examples have been provided merely for the purpose of explanation and are in no way to be construed as limiting of the present invention. While the invention has been described with reference to preferred embodiments, it is understood that the words which have been used herein are words of description and illustration, rather than words of limitations. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

What is claimed is:

1. An apparatus for determining the absence of a common reference voltage in a multi-phase electronic metering device, said electronic metering device receiving electrical energy having a plurality of phases, comprising:
   a voltage input circuit that receives a plurality of voltage phases of said electrical energy and said common reference voltage, said voltage input circuit outputting a plurality of voltage signals that are indicative of each of said voltage phases and said common reference voltage; and
   a processing system that receives said voltage signals and determines phase information with respect to said plurality of voltage phases,
   wherein said processing system determines whether or not said common reference voltage is absent in accordance with at least said phase information.

2. The apparatus as recited in claim 1, wherein said voltage signals each have substantially a same phase angle as a respective phase of said voltage phases of said electrical energy.

3. The apparatus as recited in claim 2, wherein a difference between two predetermined voltage phases is determined from said phase information.

4. The apparatus as recited in claim 3, wherein said plurality of voltage phases comprise an "A" phase, a "B" phase, and a "C" phase, wherein said difference is measured between said "A" phase and said "C" phase.

5. The apparatus as recited in claim 4, wherein said common reference voltage is said "B" phase or a neutral, and said difference is 180°.

6. The apparatus as recite in claim 4, wherein said electronic metering device is configured to meter energy usage in one of a 3-wire delta, a 4-wire wye, a 4-wire delta and a network configuration.

7. The apparatus as recited in claim 1, wherein said voltage input circuit comprises a plurality of voltage divider circuits, each being provided to receive a respective phase of said plurality of voltage phases.

8. The apparatus as recited in claim 7, wherein said processing system comprises a first processor and a second processor, said first processor comprising an analog to digital converter digital signal processor, and said second processor comprising a microcontroller.

9. The apparatus as recited in claim 8, wherein said second processor executes a predetermined sequence of operations, and wherein one of said predetermined sequence of operations includes determining a difference between two predetermined phases of said plurality of voltage phases to determine an absence of said common reference voltage.

10. The apparatus as recited in claim 9, wherein if said difference is 180°, said second processor determines that said common reference voltage is absent.

11. The apparatus of claim 1, further comprising a display operatively connected to said processing system, wherein said display indicates if said common reference voltage is absent based on a signal output by said processing system.

12. The apparatus as recited in claim 1, wherein said apparatus determines a length of time that said common reference voltage has been absent in said electrical energy metering device.

13. The apparatus as recited in claim 1, wherein said electrical energy meter comprises a two-element meter.

14. An apparatus for determining the absence of a common reference voltage in a multi-phase electrical energy metering device, said multi-phase electrical energy metering device receiving electrical energy having a plurality of phases, comprising:

a plurality of voltage divider circuits provided to receive a plurality of voltage phases of said electrical energy and said common reference voltage, said voltage divider circuits outputting voltage signals indicative of said plurality of voltage phases and said common reference voltage;

a first processor comprising an analog to digital converter/digital signal processor, said first processor receiving said voltage signals and outputting a potential indicator signal and phase information based on said voltage signals;

a second processor comprising a microcontroller that receives said potential indicator signals and said phase information and determines if said common reference voltage is absent in accordance with said potential indicator signals and said phase information; and a display connected to said second processor that indicates whether or not said common reference voltage is absent based on an output signal of said second processor.

15. The apparatus as recited in claim 14, wherein said plurality of voltage signals each have substantially a same phase angle as a respective voltage phase of said electrical energy.

16. The apparatus as recited in claim 15, wherein said characteristic is a difference between two predetermined phases of said voltage signals.

17. The apparatus as recited in claim 16, wherein said plurality of voltage phases comprise an "A" phase, a "B" phase, and a "C" phase, wherein said difference is measured between said "A" phase and said "C" phase.

18. The apparatus as recited in claim 17, wherein said common reference voltage is said "B" phase or a neutral, and said difference is 180°.

19. The apparatus as recited in claim 18, wherein said a multi-phase electrical energy metering device comprises a two-element meter, and said electrical metering device is configured to meter energy usage in one of a 3-wire delta, a 4-wire wye, a 4-wire delta and a network configuration.

20. A method of determining the absence of a common reference voltage in a two-element electrical meter, said two-element electrical meter including a display, said method comprising:

determining the presence of phases of voltage by measuring a potential of each phase;

calculating a difference between two selected phases of said voltage;

determining if said difference is a predetermined amount; and indicating on said display that said common reference voltage is absent in said two-element electrical meter if said difference equals said predetermined amount.

21. The method as recited in claim 20, wherein said determining the presence of phases of voltage by measuring a potential of each phase comprises:

comparing each phase to a predetermined threshold value; and if a voltage of each phase is at least said predetermined threshold value, then considering the phase to be present.

22. The method as recited in claim 20, wherein said predetermined amount is 180°.

23. The method as recited in claim 20, further comprising determining a length of time that said common reference voltage has been absent in said electrical energy metering device.

* * * * *

UNITED STATES PATENT AND TRADEMARK OFFICE
CERTIFICATE OF CORRECTION

PATENT NO.   : 6,236,197 B1
DATED        : May 22, 2001
INVENTOR(S)  : Holdsclaw et al.

It is certified that error appears in the above-identified patent and that said Letters Patent is hereby corrected as shown below:

Column 3,
Line 52, "AID" should read -- A/D --

Column 6,
Lines 9, 12, and 15, "AID" should read -- A/D --

Column 7,
Line 6, "AID" should read -- A/D --

Column 11,
Line 24, "AID" should read -- A/D --

Column 15,
Equation between lines 33 and 35, the subscripts and superscripts in the equation should be arranged as follows:

$$VAR = \sqrt{VA_A^2 - Watt_A^2} + \sqrt{VA_B^2 - Watt_B^2} + \sqrt{VA_C^2 - Watt_C^2}$$

Columns 15 and 16,
Each occurrence of $\sum_{zero}^{cycle}$ should read -- $\sum_{zero}^{cycle}$ --

Signed and Sealed this

Fifth Day of March, 2002

*Attest:*

*Attesting Officer*

JAMES E. ROGAN
*Director of the United States Patent and Trademark Office*